(12) United States Patent
Sano

(10) Patent No.: US 11,765,821 B2
(45) Date of Patent: Sep. 19, 2023

(54) FLEXIBLE SUBSTRATE

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 157 days.

(21) Appl. No.: 17/453,942

(22) Filed: Nov. 8, 2021

(65) Prior Publication Data

US 2022/0061155 A1    Feb. 24, 2022

Related U.S. Application Data

(63) Continuation of application No. PCT/JP2020/016339, filed on Apr. 13, 2020.

(30) Foreign Application Priority Data

May 14, 2019  (JP) ................................. 2019-091478

(51) Int. Cl.
*H05K 1/02* (2006.01)
*H05K 1/11* (2006.01)

(52) U.S. Cl.
CPC .......... *H05K 1/0296* (2013.01); *H05K 1/028* (2013.01); *H05K 1/115* (2013.01); *H05K 2201/09263* (2013.01)

(58) Field of Classification Search
None
See application file for complete search history.

(56) References Cited

U.S. PATENT DOCUMENTS

| | | | |
|---|---|---|---|
| 9,730,330 B1 | 8/2017 | Boyle et al. | |
| 10,310,560 B2 * | 6/2019 | Choi | G06F 1/1652 |
| 10,964,769 B2 * | 3/2021 | Park | H10K 59/124 |
| 2015/0282294 A1 | 10/2015 | Wakuda et al. | |
| 2015/0282296 A1 | 10/2015 | Ogura et al. | |
| 2016/0104756 A1 | 4/2016 | Lee et al. | |
| 2016/0211471 A1 | 7/2016 | Kwon et al. | |
| 2017/0181276 A1 | 6/2017 | Sawada et al. | |
| 2017/0181277 A1 * | 6/2017 | Tomita | H05K 1/0283 |

FOREIGN PATENT DOCUMENTS

| | | |
|---|---|---|
| JP | 2015-198101 A | 11/2015 |
| JP | 2015-198102 A | 11/2015 |
| JP | 2017-113088 A | 6/2017 |
| JP | 2017-118109 A | 6/2017 |

OTHER PUBLICATIONS

International Search Report dated Jun. 30, 2020 in PCT/JP2020/016339 filed on Apr. 13, 2020, 3 pages.

* cited by examiner

*Primary Examiner* — Timothy J Thompson
*Assistant Examiner* — John B Freal
(74) *Attorney, Agent, or Firm* — Maier & Maier, PLLC

(57) ABSTRACT

According to one embodiment, a flexible substrate includes flexible insulating base material, conductive lines, a support body and a coating layer. The conductive lines are provided on the insulating base material. The support body supports the insulating base material. The coating layer covers the insulating base material and the support body. The conductive lines include scanning lines and signal lines. The scanning lines extend in a first direction and are arranged side by side in a second direction intersecting the first direction. The signal lines extend in the second direction and are arranged side by side in the first direction. The support body and the coating layer have a through hole in a region enclosed by two adjacent scanning lines and two adjacent signal lines.

9 Claims, 8 Drawing Sheets

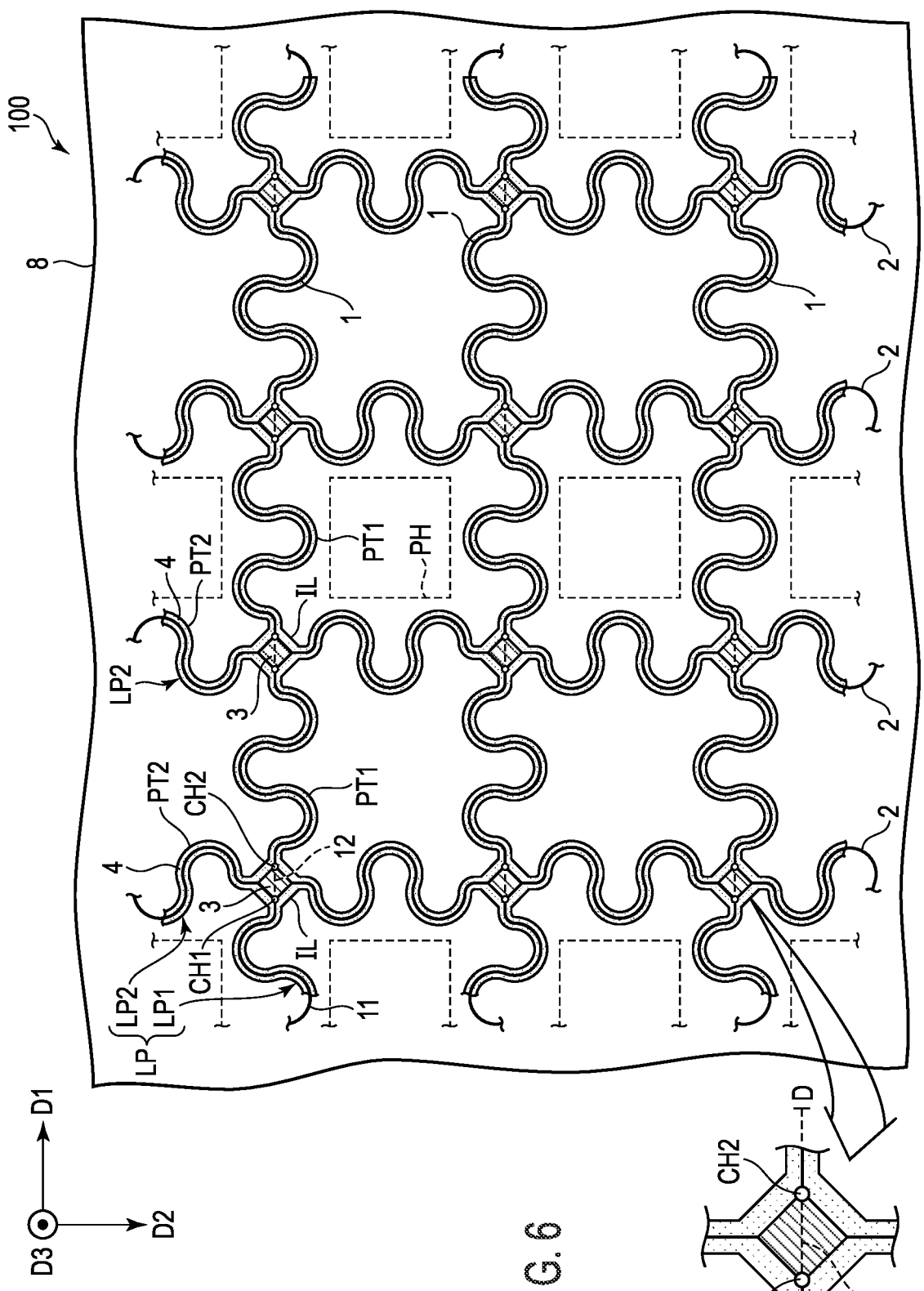
F I G. 6

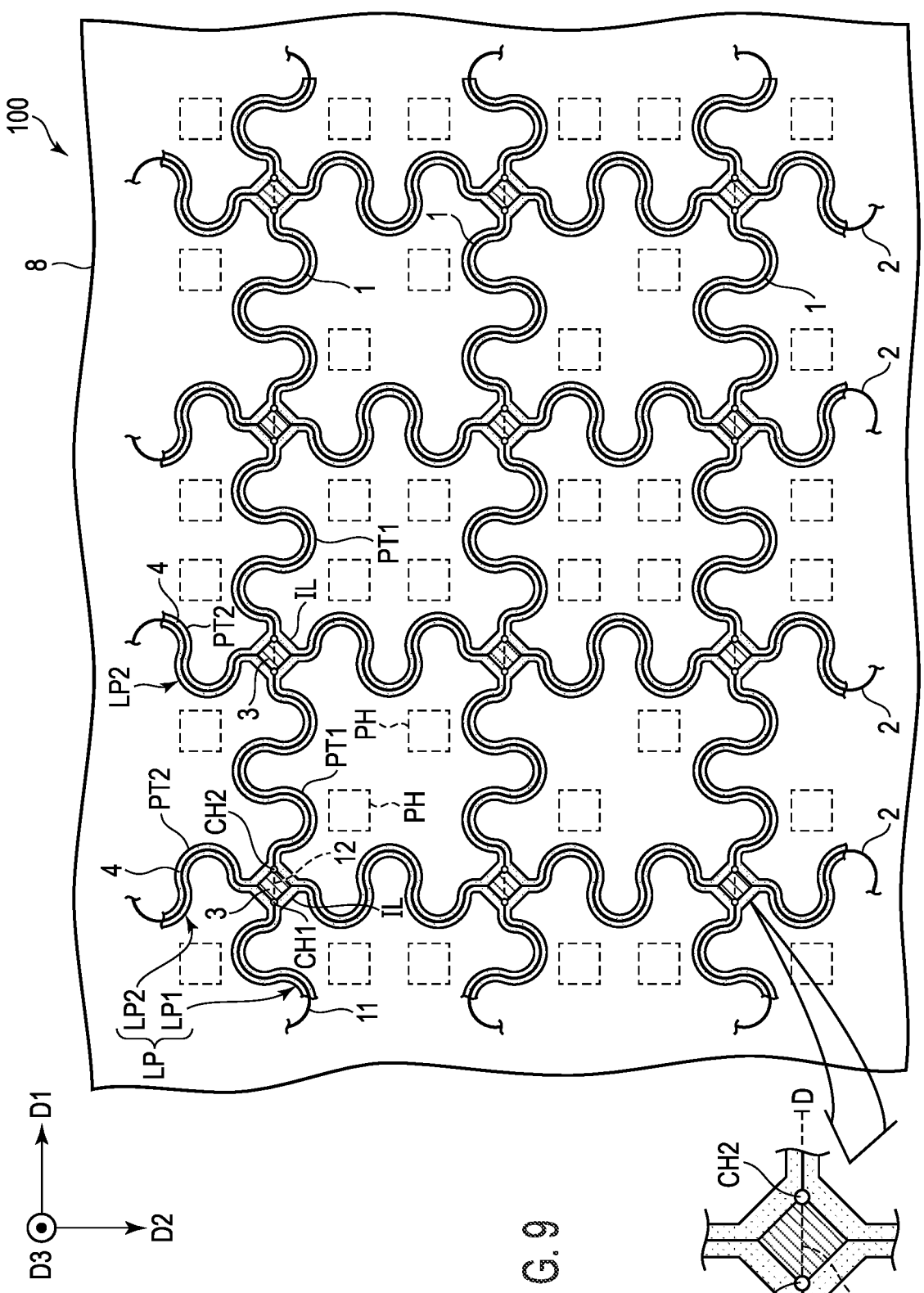
F I G. 9

FLEXIBLE SUBSTRATE

CROSS-REFERENCE TO RELATED APPLICATIONS

This application is a Continuation Application of PCT Application No. PCT/JP2020/016339, filed Apr. 13, 2020 and based upon and claiming the benefit of priority from Japanese Patent Application No. 2019-091478, filed May 14, 2019, the entire contents of all of which are incorporated herein by reference.

FIELD

Embodiments described herein relate generally to a flexible substrate.

BACKGROUND

In recent years, the use of flexible substrates with flexibility and stretchability has been studied in various fields. As an example, a flexible substrate with electrical elements arranged in a matrix can be attached to a curved surface such as a housing of an electronic device or a human body. Examples of the electrical elements include various sensors, such as touch sensors and temperature sensors, and display elements.

In flexible substrates, it is necessary to take measures to prevent conductive lines from being damaged due to stress caused by bending and stretching. As such measures, for example, it has been proposed to provide a honeycomb-shaped opening in a base material that supports the conductive line, or to make the conductive lines meandering (meander shape).

On the other hand, in the case where a flexible substrate with the above measures is attached to the human body for use, poor air permeability may cause skin disorders such as stuffiness and rashes.

BRIEF DESCRIPTION OF THE DRAWINGS

FIG. 6 is an enlarged plan view of a part of a flexible substrate of a configuration example different from that of the flexible substrate shown in FIG. 2.

FIG. 9 is an enlarged plan view of a part of a flexible substrate of a configuration example different from that of the flexible substrate shown in FIG. 2 and FIG. 6.

DETAILED DESCRIPTION

Figure 1:
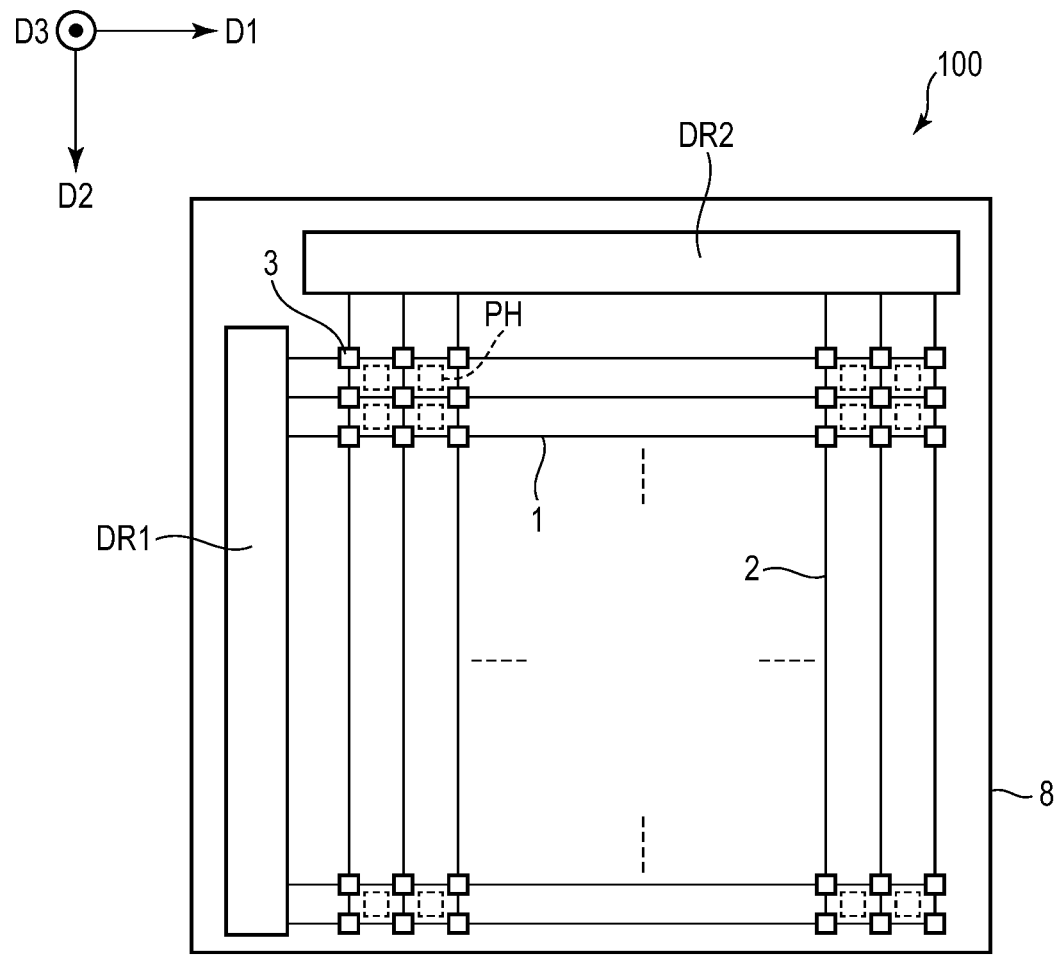
FIG. 1 is a schematic plan view of a flexible substrate according to a present embodiment.

In general, according to one embodiment, a flexible substrate includes flexible insulating base material, conductive lines, a support body and a coating layer. The conductive lines are provided on the insulating base material. The support body supports the insulating base material. The coating layer covers the insulating base material and the support body. The conductive lines include scanning lines and signal lines. The scanning lines extend in a first direction and are arranged side by side in a second direction intersecting the first direction. The signal lines extend in the second direction and are arranged side by side in the first direction. The support body and the coating layer have a through hole in a region enclosed by two adjacent scanning lines and two adjacent signal lines.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a plan view schematically showing a flexible substrate 100 according to one embodiment. In this embodiment, a first direction D1, a second direction D2 and a third direction D3 are orthogonal to each other, but they may intersect at an angle other than 90 degrees. A first direction D1, a second direction D2 and a third direction D3 are defined as shown in the figure. The first direction D1 and the second direction D2 correspond to directions parallel to a main surface of the flexible substrate 100 and intersect each other. The third direction D3 is orthogonal to the first direction D1 and the second direction D2 and corresponds to a thickness direction of flexible substrate 100. The first direction D1 and the second direction D2 are normal to each other in this embodiment, but they may intersect at an angle other than right angles.

A flexible substrate 100 comprises a plurality of scanning lines 1, a plurality of signal lines 2, a plurality of electrical elements 3, a support body 8, a scanning line driver DR1, and a signal line driver DR2. The scanning line driver DR1 and the signal line driver DR2 may be provided outside the flexible substrate 100. The scanning lines 1, signal lines 2, and electrical elements 3 are provided on the support body 8. The plurality of scanning lines 1 extend overall in a first direction D1 and are lined up in a second direction D2. Each of the plurality of scanning lines 1 is electrically connected to the scanning line driver DR1. The plurality of signal lines 2 extend overall in the second direction D2 and are lined up in the first direction D1. Each of the plurality of signal lines 2 is electrically connected to the signal line driver DR2. Each of the electrical elements 3 is provided at the intersection of the scanning line 1 and the signal line 2, and is electrically connected to the scanning line 1 and the signal line 2. A through hole (ventilation hole) PH is provided in a region enclosed by two adjacent scanning lines 1 and two adjacent signal lines 2. In FIG. 1, a case in which the through holes PH are arranged in a matrix in the first and second directions D1 and D2 is illustrated; however, the method of arranging the through holes PH is not limited thereto.

Figure 2:
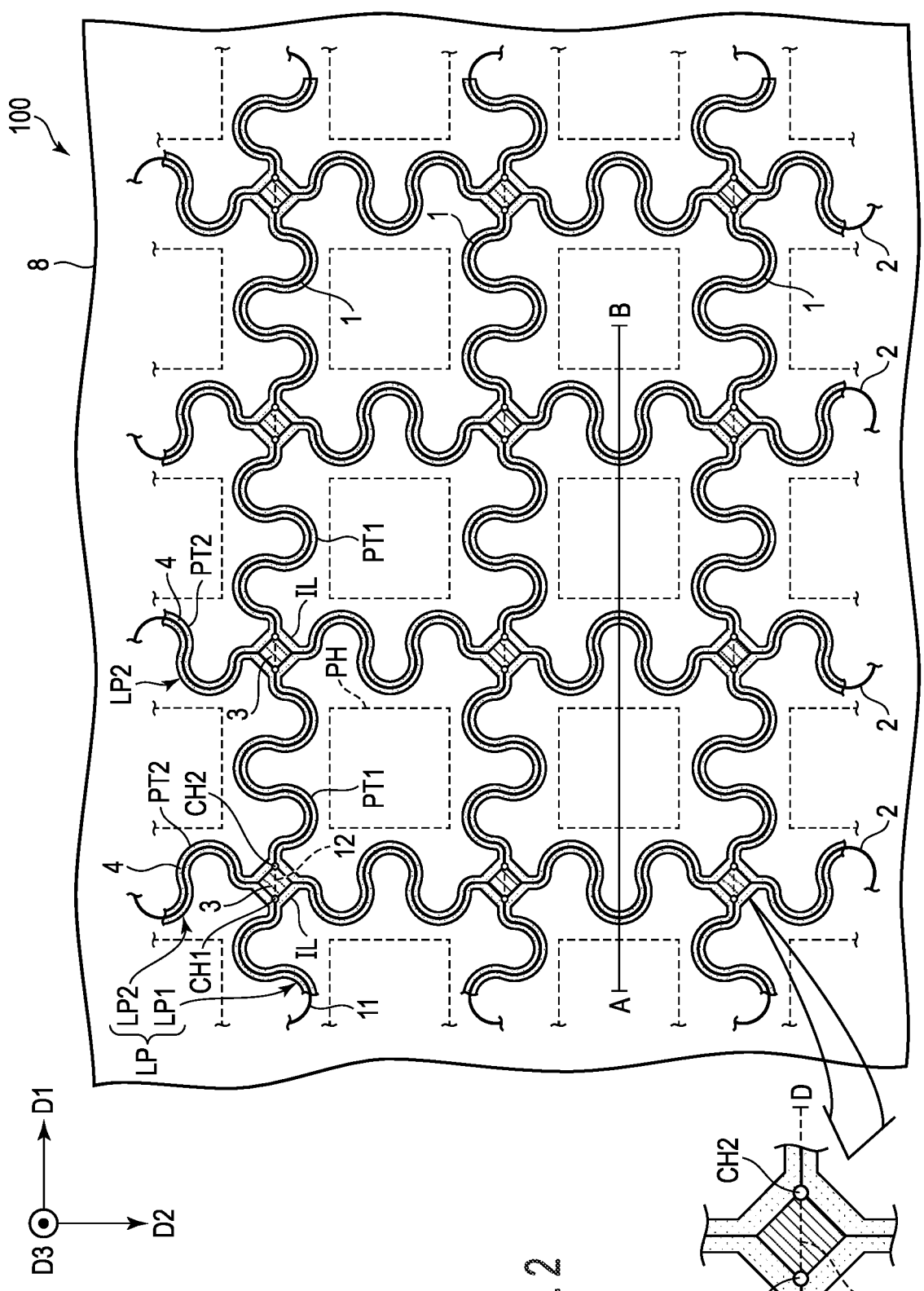
FIG. 2 is an enlarged plan view of a part of the flexible substrate shown in FIG. 1.

FIG. 2 is an enlarged plan view of a part of the flexible substrate 100 shown in FIG. 1. In addition to the above, the flexible substrate 100 comprises an insulating base material 4 that supports the scanning lines 1 and signal lines 2. The insulating base material 4 has elasticity and flexibility. The insulating base material 4 can be made of polyimide, for example; however, is not limited thereto.

The insulating base material 4 includes a plurality of first portions PT1 extending in the first direction D1 and arranged side by side in the second direction D2, a plurality of second portions PT2 extending in the second direction D2 and arranged side by side in the first direction D1, and a plurality of island-shaped portions IL located at the intersection of the first portions PT1 and the second portions PT2. The first portions PT1 and the second portions PT2 are each formed in wavy shapes. The island-shaped portions IL are connected to the first portions PT1 and the second portions PT2.

The scanning line 1 is located on the first portion PT1 and is arranged in a wavy shape. The signal line 2 is located on the second portion PT2 and is arranged in a wavy shape. The scanning line 1 and the signal line 2 are examples of conductive lines provided on the flexible substrate 100. The scanning line 1 and the signal line 2 can be formed of, for example, metallic materials or transparent conductive materials, and may be in a single-layer structure or in a stacked layer structure. In addition to the scanning line 1 and the signal line 2, the flexible substrate 100 may comprise other types of conductive lines such as a power supply line that supplies power to the electrical element 3.

The scanning line 1 includes a first conductive line 11 shown by a solid line, and a second conductive line 12 shown by a broken line. The second conductive line 12 is superposed on the electrical element 3. The first conductive line 11 and the second conductive line 12 are located on different layers from each other and are electrically connected through contact holes CH1 and CH2.

The scanning line 1 supplies scanning signals to the electrical element 3. For example, in a case where the electrical element 3 involves outputting a signal such as a sensor, the signal line 2 is supplied with the output signal from the electrical element 3. Also, in a case where the electrical element 3 is one that operates in response to an input signal, such as a light-emitting element or an actuator, as described later, a drive signal is supplied to the signal line 2. A controller, including a supply source of the scanning signal, a supply source of the drive signal, or a processor that processes the output signal, may be provided in the flexible substrate 100 or in a device connected to the flexible substrate 100.

The electrical element 3 is located on the island-shaped portion IL. The electrical element 3 is smaller than the island-shaped portion IL, and in FIG. 2, the island-shaped portion IL protrudes from the edge of the electrical element 3. For example, the electrical element 3 can be a sensor, semiconductor, or actuator. For example, as a sensor, an optical sensor that receives visible light or near-infrared light, a temperature sensor, a pressure sensor, or a touch sensor can be applied. For example, as a semiconductor element, a light emitting element, a light receiving element, a diode, or a transistor can be applied. In a case where the electrical element 3 is a light-emitting element, a flexible display having flexibility and stretchability can be realized. As light-emitting elements, for example, light-emitting diodes and organic electroluminescent elements with a size of around 100 μm, such as mini-LEDs and micro-LEDs, can be applied. In a case where the electrical element 3 is an actuator, for example, a piezoelectric element can be applied. The electrical elements 3 are not limited to those illustrated here, and other elements with various functions can be applied. The electrical element 3 may be a capacitor, resistor, etc. The arrangement position and shape of the electrical elements 3 are not limited to the example shown in FIG. 2.

In the present embodiment, the insulating base material 4, scanning line 1, signal line 2, first organic insulating layer 5 and second organic insulating layer 6 described later are collectively referred to as a line portion LP. The line portion LP is located on the support body 8. The line portion LP includes a plurality of corrugated (curved) first line portions LP1 extending in the first direction D1 and arranged side by side in the second direction D2, and a plurality of corrugated (curved) second line portions LP2 extending in the second direction D2 and arranged side by side in the first direction D1. The first line portion LP1 includes the first portion PT1 of the insulating base material 4 and the scanning line 1 described above. The second line portion LP2 includes the second portion PT2 of the insulating base material 4 and the signal line 2 described above.

As shown in FIG. 2, a through hole PH is provided in a region enclosed by two adjacent first line portions LP1 and two adjacent second line portions LP2. As described above, since the first line portion LP1 includes the scanning line 1 and the second line portion LP2 includes the signal line 2, in the present embodiment, the region enclosed by the two adjacent first line portions LP1 and the two adjacent second line portions LP2 and a region enclosed by two adjacent scanning lines 1 and two adjacent signal lines 2 are the same.

The through holes PH are holes that penetrate a coating layer 7 and the support body 8, which will be described later. FIG. 2 illustrates a case where the through hole PH is provided in a square shape in plan view, but the shape of the through hole PH is not limited thereto and may be any shape. For example, the through hole PH may be formed in a polygonal, circular, or elliptical shape different from the above-mentioned square shape. Alternatively, the through hole PH may be formed in a wavy shape similar to the region enclosed by the two adjacent first line portions LP1 and the two adjacent second line portions LP2.

Figure 3:
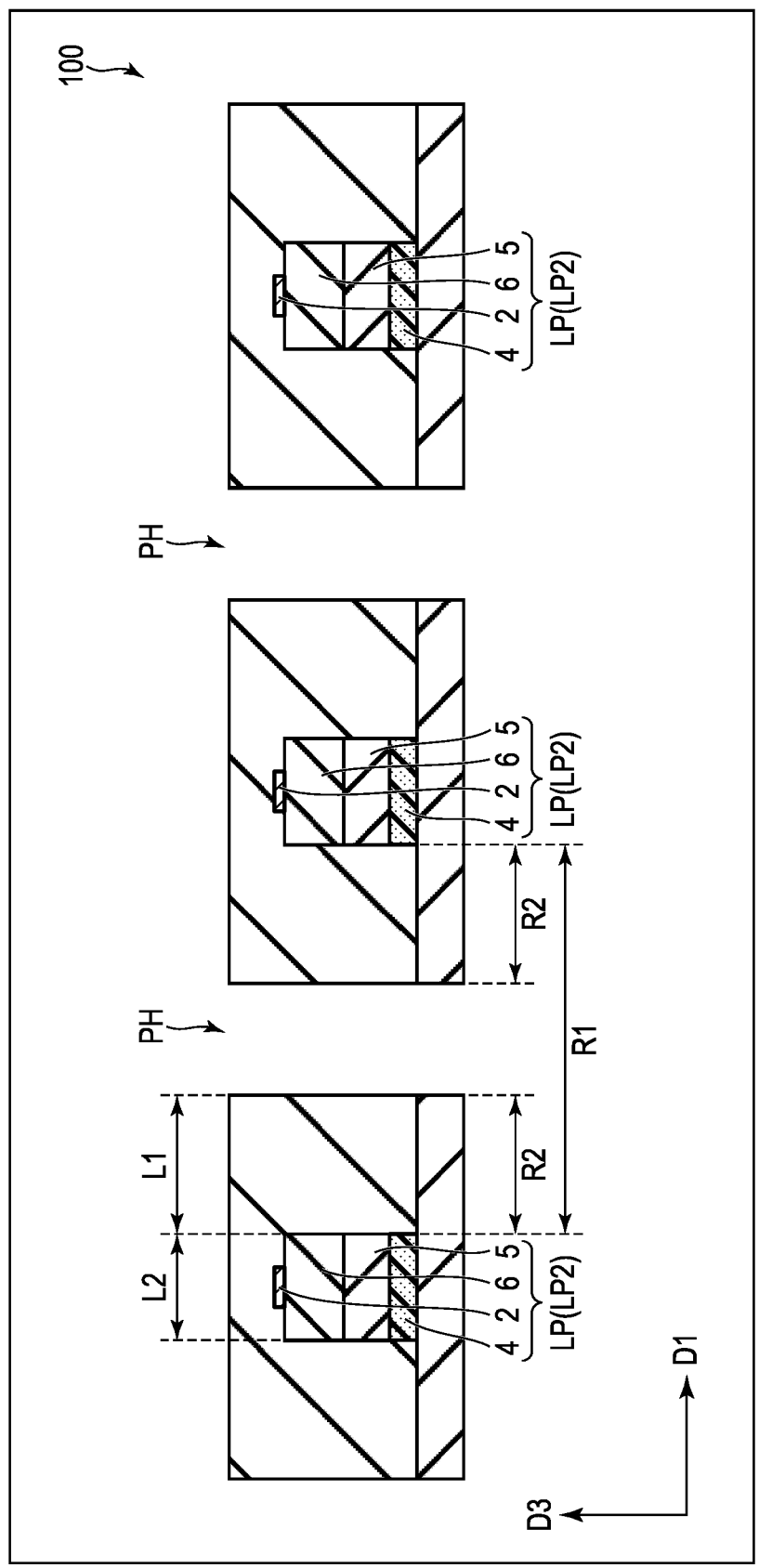
FIG. 3 is a cross-sectional view of the flexible substrate taken along line A-B shown in FIG. 2.

FIG. 3 is a cross-sectional view of the flexible substrate 100 taken along line A-B shown in FIG. 2. The flexible substrate 100 further comprises a first organic insulating layer 5, a second organic insulating layer 6, and a coating layer 7, in addition to the elements described above.

The support body 8 has a first surface SF1. The line portion LP is located on the first surface SF1. The through hole PH is located between two adjacent line portions LP.

The line portions LP are configured by the insulating base material 4, the first organic insulating layer 5, the second organic insulating layer 6, the signal line 2, and the scanning line 1 shown in FIG. 1. Among these elements, the second line portion LP2 is configured by the insulating base material 4, the first organic insulating layer 5, the second organic insulating layer 6, and the signal line 2, as shown in FIG. 3. The first line portion LP1, although not shown in the drawing, is configured by the insulating base material 4, first organic insulating layer 5, second organic insulating layer 6, and scanning line 1.

The insulating base material 4 is located on the first surface SF1. The first organic insulating layer 5 covers the insulating base material 4. The second organic insulating layer 6 covers the first organic insulating layer 5. The signal line 2 is located on top of the second organic insulating layer 6.

The coating layer 7 covers the line portion LP. In other words, the coating layer 7 covers the signal line 2, the insulating base material 4, the first organic insulating layer 5, and the second organic insulating layer 6. In addition, the coating layer 7 is in contact with the first surface SF1 in a region R2 other than a region where the through hole PH is located in a region R1 between the two adjacent line portions LP. Focusing on one of the two regions R2 included in one of the above-mentioned regions R1, a length L1 along the first direction D1 is longer than a length L2 along the first direction D1 of the line portion LP (L1>L2). More specifically, the length L1 is preferably at least twice as long as the length L2 and about three times as long as the length L2. For example, in a case where the length L2 of the line portion LP is 30 µm, the length L1 of the region R2 is preferably about 100 µm.

Here, the description of one of the two regions R2 included in one of the regions R1 is provided; however, the same also applies to the other region R2. In addition, here, since the cross-sectional view in FIG. 3 is used as an example, the above-mentioned relationship is described between the length L2 along the first direction D1 of the line portion LP (second line portion LP2) and the length L1 along the first direction D1 of the region R2; however, the same applies to the first line portion LP1 as well. In other words, the same relationship as the relationship described above is achieved between the length along the second direction D2 of the first line portion LP1 and the length along the second direction D2 of a region corresponding to the region R2.

The above relationship between the length L1 of the region R2 and the length L2 of the line portion LP allows the length L1 of the region R2, that is, the length L1 along the first direction D1 from the through hole PH to the line portion LP to be sufficiently secured even if moisture enters from between the coating layer 7 and the support 8 at the through hole PH. Therefore, it is possible to suppress the possibility of the line portion LP being corroded by moisture. In addition, since the above relationship between the length L1 of the region R2 and the length L2 of the line portion LP allows the length L1 of the region R2, that is, the length L1 along the first direction D1 of the first surface SF1 where the coating layer 7 and the support body 8 come in contact to be sufficiently secured, the possibility of the coating layer 7 peeling off from the support body 8 can be suppressed.

Figure 4:
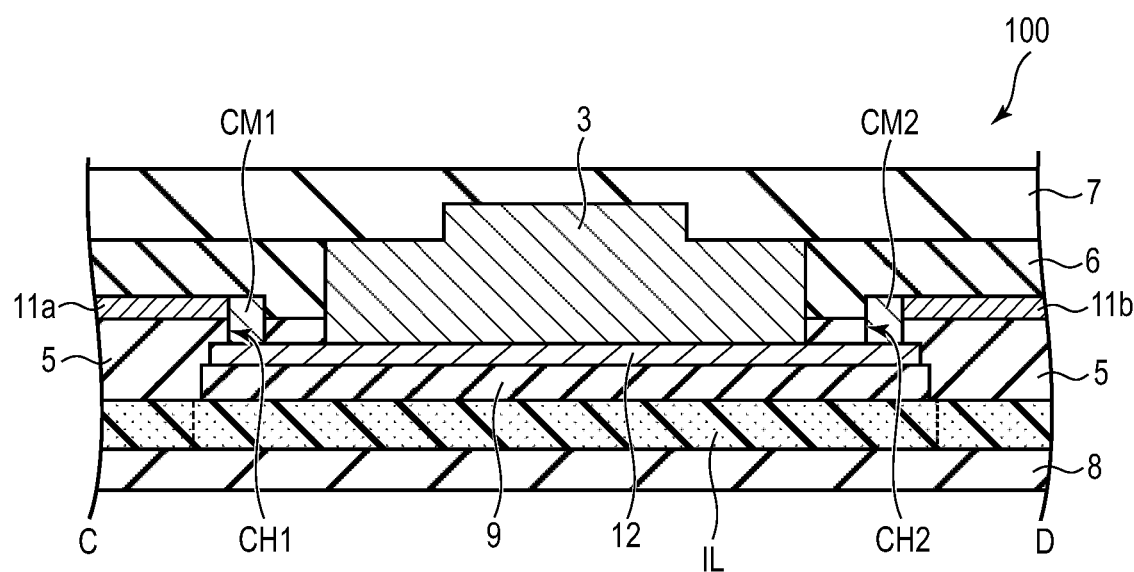
FIG. 4 is a cross-sectional view of the flexible substrate taken along line C-D shown in FIG. 2.

FIG. 4 is a cross-sectional view of the flexible substrate 100 taken along line C-D shown in FIG. 2. The electrical element 3 is placed on the island-shaped portion IL of the insulating base material 4. An inorganic insulating layer 9 (passivation layer) is placed between the electrical element 3 and the island-shaped portion IL. The inorganic insulating layer 9 is formed in an island shape and overlaps with the electrical element 3 (or the island-shaped portion IL) in a plan view. First conductive line portions 11a and 11b are disposed on the first organic insulating layer 5 and are covered by the second organic insulating layer 6. A second conductive line portion 12 is disposed on the inorganic insulating layer 9 and is electrically connected to the electrical element 3. In the example shown in FIG. 4, both ends of the second conductive line portion 12 are covered by the first organic insulating layer 5.

The contact holes CH1 and CH2 are provided on the first organic insulating layer 5. The first conductive line portion 11a is electrically connected to the second conductive line portion 12 via a connection member CM1 disposed in the contact hole CH1. Similarly, the first conductive line portion 11b is electrically connected to the second conductive line portion 12 via a connection member CM2 disposed in the contact hole CH2. The connection member CM1 may be a part of the first conductive line portion 11a, or may be provided separately from the first conductive line portion 11a. The connection member CM2 may be a part of the first conductive line portion 11b, or may be provided separately from the first conductive line portion 11b.

As described above, an island-shaped inorganic insulating layer 9 is disposed between the electrical element 3 and the insulating base material 4. This inorganic insulating layer 9 functions as a protective film that suppresses the penetration of moisture, etc., into the electrical elements 3 and the second conductive line portion 12 of the scanning line 1. As a result, the reliability of the flexible substrate 100 is improved. In addition, although inorganic films generally tend to crack easier than organic films, since the inorganic insulating layer 9 is not provided below the first conductive line portions 11a and 11b of the scanning line 1, disconnection at the first conductive line portions 11a and 11b is suppressed. The same applies to signal lines not shown in the drawing. Furthermore, compared to a case where the inorganic insulating layer 9 is provided on the entire flexible substrate 100, the elasticity and flexibility of the flexible substrate 100 are less likely to be impaired.

In addition, in the scanning line 1, since the second conductive line portion 12 overlapping the electrical element 3 is disposed in a different layer from the first conductive line portions 11a and 11b, the degree of freedom of design in the vicinity of the electrical element 3 is improved. In addition, since the contact holes CH1 and CH2 are provided above the inorganic insulating layer 9, connection failures are suppressed at connection positions between the first conductive line portion 11a and the second conductive line portion 12 and between the first conductive line portion 11b and the second conductive line portion 12.

Here, the effects of the flexible substrate 100 of the present embodiment will be explained using a comparative example. The comparative example is intended to illustrate some of the effects that the flexible substrate 100 of the present embodiment can achieve, and does not exclude the configurations and effects that are common between the comparative example and the present embodiment from the scope of the present invention.

Figure 5:
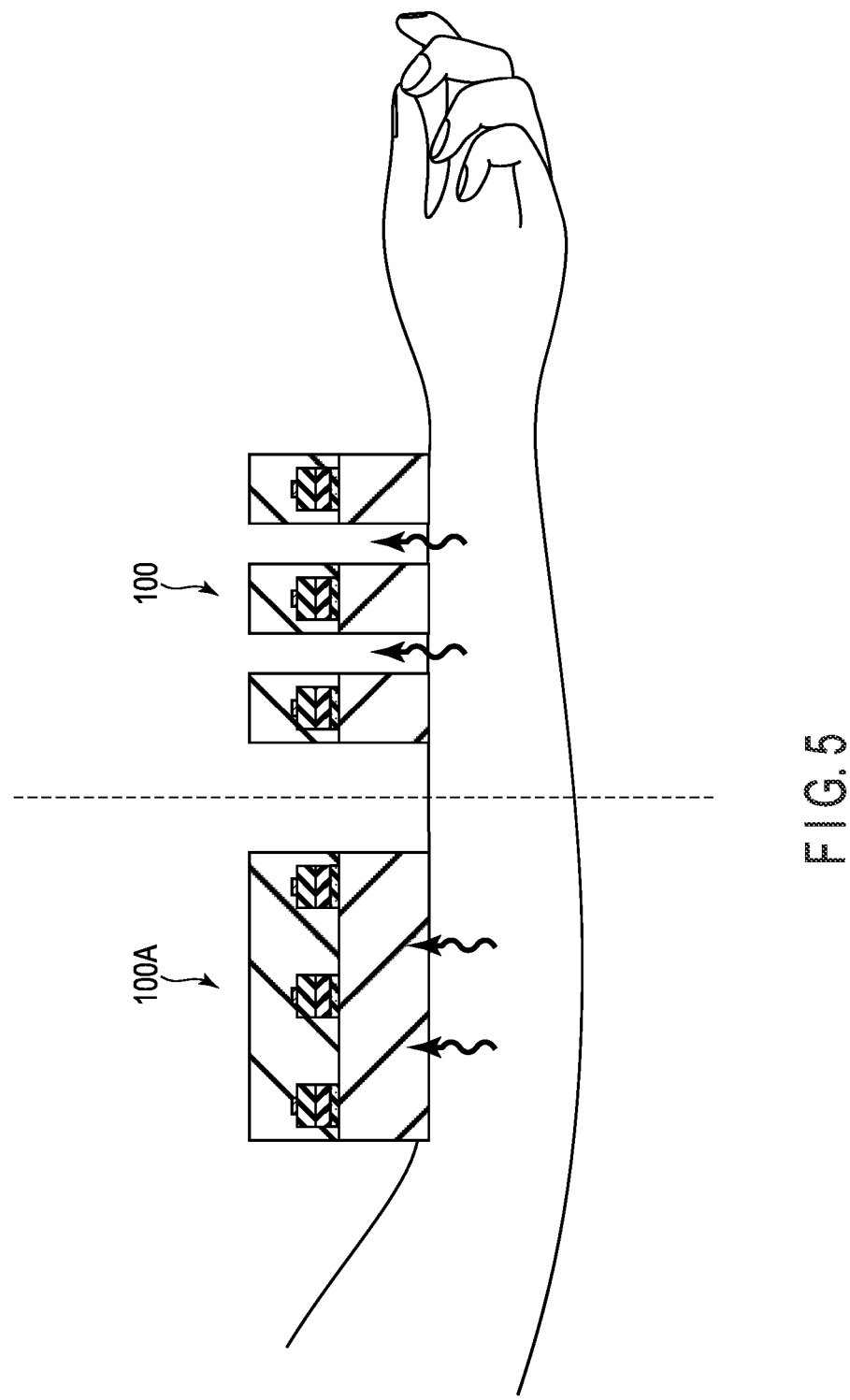
FIG. 5 is a cross-sectional view of the flexible substrate according to the present embodiment and a cross-sectional view of a flexible substrate according to a comparative example.

FIG. 5 is a cross-section of the flexible substrate 100 of the present embodiment and a flexible substrate 100A of the comparative example. The flexible substrate 100A of the comparative example differs from the flexible substrate 100 of the present embodiment in that a through hole PH is not provided between the two adjacent line portions LP. In FIG. 5, the flexible substrate is assumed to be used by attaching the flexible substrate to the human body.

In the case where the flexible substrate 100A of the comparative example is attached to the human body as shown in FIG. 5, since it does not have a means to release sweat and heat generated in the area where the flexible substrate 100A is attached, skin disorders such as stuffiness and rashes may occur. In contrast, as mentioned above, the flexible substrate 100 of the present embodiment has a through hole PH provided between two adjacent line portions LP, which ensures air permeability, and thus makes it possible to suppress the possibility of skin disorder (mainly, heat-induced skin disorder) such as stuffiness and rashes mentioned above.

Other configuration examples will be described below.

FIG. 6 is a plan view of another configuration example. The configuration example shown in FIG. 6 is different from the configuration example shown in FIG. 2 in that the through hole PH is not provided in all of the regions enclosed by the two adjacent first line portions LP1 and the two adjacent second line portions LP2, but in some of the regions enclosed by the two adjacent first line portions LP1 and the two adjacent second line portions LP2 (in other words, the through hole PH is provided partially).

In this configuration example, as well as in the configuration example above, since the through hole PH ensures air permeability, the possibility of skin disorder such as stuffiness and rashes can be suppressed from occurring. In the case of the configuration example shown in FIG. 6, it is also possible to obtain the unique effects described below.

Figure 7:
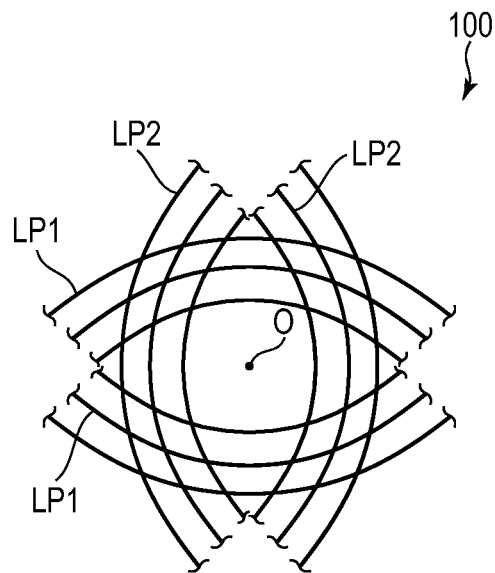
FIG. 7 is a plan view of a state in which the flexible substrate in the configuration shown in FIG. 2 is elongated.

FIG. 7 is a schematic plan view of the flexible substrate 100 of the configuration example shown in FIG. 2, showing a state in which the flexible substrate 100 is elongated by being attached to a curved surface where the curvature becomes larger at an area closer to point O. In the case where the flexible substrate 100 is used by being attached to a curved surface, the region enclosed by the two adjacent first line portions LP1 and the two adjacent second line portions LP2 tends to be deformed to a greater extent at a portion where the curvature is large. In the case of the configuration example shown in FIG. 2, the flexible substrate 100 is provided with through holes PH in all of the regions enclosed by the two adjacent first line portions LP1 and the two adjacent second line portions LP2, and the in-plane elongation rate of the flexible substrate 100 is uniform; thus, without any difference. According to this, the effect of the above-mentioned tendency will be directly passed on. Therefore, in the case where the flexible substrate 100 of the configuration example shown in FIG. 2 is attached to a curved surface and elongated, as shown in FIG. 7, the region enclosed by the two adjacent first line portions LP1 and the two adjacent second line portions LP2 will be deformed to a greater extent in the area closer to point O, which is a point where the curvature is large.

In such a case, the electrical element 3 located at the intersection of the first line portion LP1 and the second line portion LP2 is non-uniformly arranged in the plane of the flexible substrate 100 (in other words, the pitch of the electrical elements 3 provided on the flexible substrate 100 becomes non-uniform). This may cause a problem that the electrical elements 3 would not function uniformly in the plane of the flexible substrate 100. According to the flexible substrate 100 of the configuration example shown in FIG. 6, this problem can be solved.

Figure 8:
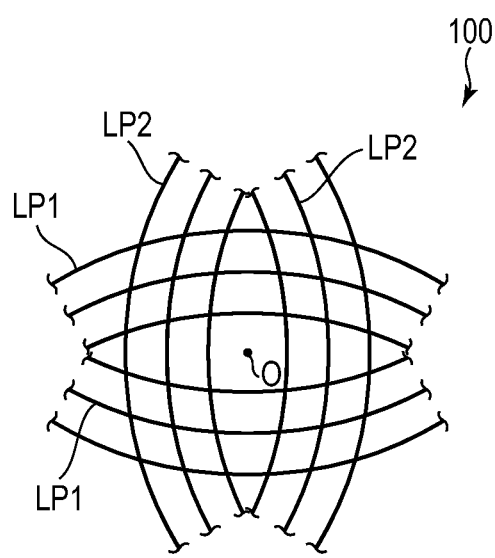
FIG. 8 is a plan view of a state in which the flexible substrate in the configuration shown in FIG. 6 is elongated.

FIG. 8 is a schematic plan view of the flexible substrate 100 of the configuration example shown in FIG. 6, showing a state in which the flexible substrate 100 is elongated by being attached to a curved surface where the curvature becomes larger at an area closer to point O. In the case of the configuration example shown in FIG. 6, since the flexible substrate 100 is partially provided with through holes PH, a difference occurs in the in-plane elongation rate of the flexible substrate 100. In other words, with respect to the region enclosed by the two adjacent first line portions LP1 and the two adjacent second line portions LP2, the flexible substrate 100 easily elongates in the region where the through hole PH is provided and hardly elongates in the region where the through hole PH is not provided. For this reason, by not providing through holes PH in a region that is presumed to be located near an area with a large curvature when attaching the flexible substrate 100 (in other words, a region corresponding to an area where the curvature is large on the curved surface to which the flexible substrate 100 is attached), as shown in FIG. 8, it is possible to suppress a large deformation of the region enclosed by the two adjacent first line portions LP1 and the two adjacent second line portions LP2, even at the area near point O where the curvature is large. As a result, it is possible to solve the above problem. Thus, according to the configuration example shown in FIG. 6, it is possible to obtain a unique effect in which the pitch of the electrical elements 3 provided on the flexible substrate 100 can be made uniform even during elongation.

FIG. 9 is a plan view of another configuration example. The configuration example shown in FIG. 9 differs from the configuration example shown in FIG. 2 in that a plurality of through holes PH are provided instead of one through hole PH being provided in the region enclosed by the two adjacent first line portions LP1 and the two adjacent second line portions LP2.

Also in this configuration example, as in the above configuration example, the through holes PH ensure air permeability, thereby suppressing the possibility of the occurrence of skin disorder such as stuffiness and rashes. In addition, for example, by changing the number of the plurality of through holes PH provided in each region enclosed by the two adjacent first line portions LP1 and the two adjacent second line portions LP2, it is possible to generate a difference in the elongation rate in the plane of the flexible substrate 100. Therefore, as shown in the configuration example in FIG. 6, it is possible to make the pitch of the electrical elements 3 provided on the flexible substrate 100 uniform even during elongation.

Although the drawings are omitted here, in addition to the other configuration examples shown in FIGS. 6 and 9, by changing the shape and size of the through holes PH provided in each region enclosed by the two adjacent first line portions LP1 and the two adjacent second line portions LP2, it is possible to make a difference in the in-plane elongation rate of the flexible substrate 100. In other words, it is possible to make the elongation rate of the flexible substrate 100 different in the plane. That is, even in such a configuration example, it is possible to make the pitch of the electrical elements 3 provided on the flexible substrate 100 uniform during elongation.

As explained above, according to one embodiment, it is possible to provide a flexible substrate that can suppress the occurrence of skin disorder.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
   a flexible insulating base material;
   conductive lines provided on the insulating base material;
   a support body that supports the insulating base material; and
   a coating layer that covers the insulating base material and the support body, wherein
   the conductive lines include:
   scanning lines extending in a first direction and arranged side by side in a second direction intersecting the first direction; and signal lines extending in the second direction and arranged side by side in the first direction, and the support body and the coating layer have a through hole in a region enclosed by two adjacent scanning lines and two adjacent signal lines.

2. A flexible substrate of claim 1, wherein the insulating base material includes a line portion overlapping the conductive line and an island-shaped portion disposed between the line portions.

3. A flexible substrate of claim 2, wherein the line portion includes:

a first line portion that includes the scanning line, extends in the first direction, and is arranged side by side in the second direction, and a second line portion that includes the signal line, extends in the second direction, and is arranged side by side in the first direction, and the line portion is formed in a curved shape between the island-shaped portions.

4. A flexible substrate of claim 3, wherein the coating layer covers the support body in a region between the first line portion and the through hole, and a length along the second direction between the first line portion and the through hole is equal to or longer than twice a length of the first line portion along the second direction.

5. A flexible substrate of claim 3, wherein the coating layer covers the support body in a region between the second line portion and the through hole, and a length along the first direction between the second line portion and the through hole is equal to or longer than twice a length of the second line portion along the first direction.

6. A flexible substrate of claim 1, wherein the through hole is provided in numbers in a region enclosed by the two adjacent scanning lines and the two adjacent signal lines.

7. A flexible substrate of claim 1, wherein the through hole is provided in all of the regions enclosed by the two adjacent scanning lines and the two adjacent signal lines.

8. A flexible substrate of claim 1, wherein the through hole is not provided in all of the regions enclosed by the two adjacent scanning lines and the two adjacent signal lines.

9. A flexible substrate of claim 8, wherein, among the regions enclosed by the two adjacent scanning lines and the two adjacent signal lines, the through hole is not provided in a region that corresponds to an area where curvature is large on a curved surface to which the flexible substrate is attached.

* * * * *